United States Patent
Aubel et al.

(10) Patent No.: US 8,268,679 B2
(45) Date of Patent: Sep. 18, 2012

(54) SEMICONDUCTOR DEVICE COMPRISING EFUSES OF ENHANCED PROGRAMMING EFFICIENCY

(75) Inventors: Oliver Aubel, Dresden (DE); Jens Poppe, Radebeul (DE); Andreas Kurz, Dresden (DE); Roman Boschke, Dresden (DE)

(73) Assignee: Globalfoundries, Inc., Grand Cayman (KY)

(*) Notice: Subject to any disclaimer, the term of this patent is extended or adjusted under 35 U.S.C. 154(b) by 297 days.

(21) Appl. No.: 12/579,654

(22) Filed: Oct. 15, 2009

(65) Prior Publication Data

US 2010/0107403 A1    May 6, 2010

(30) Foreign Application Priority Data

Oct. 31, 2008    (DE) .............. 10 2008 054 073

(51) Int. Cl.
    *H01L 21/732*    (2006.01)
(52) U.S. Cl. ........ 438/132; 438/131; 438/215; 438/281; 438/333; 438/467; 257/E23.149; 257/E21.592; 29/623
(58) Field of Classification Search .............. 438/132, 438/131, 215, 281, 333, 467; 257/E21.592, 257/E23.149
    See application file for complete search history.

(56) References Cited

U.S. PATENT DOCUMENTS

| | | | |
|---|---|---|---|
| 5,420,456 A | 5/1995 | Galbi et al. ............ 257/529 |
| 6,501,107 B1 | 12/2002 | Sinclair et al. ......... 257/209 |
| 6,933,591 B1 | 8/2005 | Sidhu et al. ............ 257/665 |
| 7,282,751 B2 | 10/2007 | Ueda ....................... 257/209 |
| 2003/0141568 A1 | 7/2003 | Sato et al. ............... 257/529 |
| 2007/0210414 A1* | 9/2007 | Iwamoto et al. ........ 257/529 |
| 2008/0206939 A1 | 8/2008 | Min et al. ................ 438/197 |
| 2009/0101989 A1* | 4/2009 | Chen et al. .............. 257/379 |
| 2009/0140382 A1 | 6/2009 | Gao et al. ................ 257/529 |

FOREIGN PATENT DOCUMENTS

| | | |
|---|---|---|
| CN | 1011700999 A | 4/2008 |
| EP | 0 563 852 A1 | 3/1993 |
| JP | 4-51563 | 2/1992 |
| WO | WO 2004/075221 A2 | 9/2004 |

OTHER PUBLICATIONS

PCT Search Report and Written Opinion from PCT/US2009/005901 dated Feb. 15, 2010.
Robson et al., "Electrically Programmable Fuse (eFUSE): From Memory Redundancy to Autonomic Chips," IEEE 2007 Custom Integrated Circuits Conference (CICC), pp. 799-804, 2007.
Translation of Official Communication from German Patent Office for German Patent Application No. 10 2008 054 073.0 dated Oct. 5, 2009.

* cited by examiner

*Primary Examiner* — Minchul Yang
(74) *Attorney, Agent, or Firm* — Williams, Morgan & Amerson, P.C.

(57) ABSTRACT

In sophisticated integrated circuits, an electronic fuse may be formed such that an increased sensitivity to electromigration may be accomplished by including at least one region of increased current density. This may be accomplished by forming a corresponding fuse region as a non-linear configuration, wherein at corresponding connection portions of linear segments, the desired enhanced current crowding may occur during the application of the programming voltage. Hence, increased reliability and more space-efficient layout of the electronic fuses may be accomplished.

13 Claims, 6 Drawing Sheets

SEMICONDUCTOR DEVICE COMPRISING EFUSES OF ENHANCED PROGRAMMING EFFICIENCY

BACKGROUND OF THE INVENTION

1. Field of the Invention

The present disclosure generally relates to the field of fabricating integrated circuits, and, more particularly, to forming electronic fuses for providing device-internal programming capabilities in complex integrated circuits.

2. Description of the Related Art

In modern integrated circuits, a very high number of individual circuit elements, such as field effect transistors in the form of CMOS, NMOS, PMOS elements, resistors, capacitors and the like are formed on a single chip area. Typically, feature sizes of these circuit elements are steadily decreasing with the introduction of every new circuit generation to provide currently available integrated circuits with an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance. In addition to the large number of transistor elements, a plurality of passive circuit elements, such as capacitors, resistors and the like, are typically formed in integrated circuits that are used for a plurality of purposes, such as for decoupling.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices, an increasing amount of storage capacity may be provided on chip with the CPU core, thereby also significantly enhancing the overall performance of modern computer devices.

In modern integrated circuits, minimal features sizes have now reached approximately 50 nm and less, thereby providing the possibility of incorporating various functional circuit portions at a given chip area, wherein, however, the various circuit portions may have a significantly different performance, for instance with respect to lifetime, reliability and the like. For example, the operating speed of a digital circuit portion, such as a CPU core and the like, may depend on the configuration of the individual transistor elements and also on the characteristics of the metallization system, which may include a plurality of stacked metallization layers so as to comply with a required complex circuit layout. Thus, highly sophisticated manufacturing techniques may be required in order to provide the minimum critical feature sizes of the speed-critical circuit components. For example, sophisticated digital circuitry may be used on the basis of field effect transistors which represent circuit components in which conductivity of a channel region is controlled on the basis of a gate electrode that is separated from the channel region by a thin dielectric material. Performance of the individual field effect transistors is determined, among other things, by the capability of the transistor to switch from a high impedance state into a low impedance state at high speeds, wherein, also, a sufficiently high current may be driven in the low impedance state. This drive current capability is determined, among other things, by the length of the conductive channel that forms in the channel region upon application of an appropriate control voltage to the gate electrode. For this reason, and in view of ever increasing the overall packing density of sophisticated semiconductor devices, the channel length and thus the length of the gate electrode is continuously being reduced, which in turn may require an appropriate adaptation of the capacitive coupling of the gate electrode to the channel region. Consequently, the thickness of the gate dielectric material may also have to be reduced in order to maintain controllability of the conductive channel at a desired high level. However, the shrinkage of the gate dielectric thickness may be associated with an exponential increase of the leakage currents, which may directly channel through the thin gate dielectric material, thereby contributing to enhanced power consumption and thus waste heat, which may contribute to sophisticated conditions during operation of the semiconductor device. Moreover, charge carriers may be injected into the gate dielectric material and may also contribute to a significant degradation of transistor characteristics, such as threshold voltage of the transistors, thereby also contributing to variability of the transistor characteristics over the lifetime of the product. Consequently, reliability and performance of certain sophisticated circuit portions may be determined by material characteristics and process techniques for forming highly sophisticated circuit elements, while other circuit portions may include less critical devices which may thus provide a different behavior over the lifetime compared to critical circuit portions. Consequently, the combination of the various circuit portions in a single semiconductor device may result in a significant different behavior with respect to performance and reliability, wherein the variations of the overall manufacturing process flow may also contribute to a further discrepancy between the various circuit portions. For these reasons, for complex integrated circuits, frequently additional mechanisms may be implemented to allow the circuit itself to adapt performance of certain circuit portions to comply with performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, resetting overall circuit speed and the like.

For this purpose, so-called electronic fuses or e-fuses may be provided in the semiconductor devices, which may represent electronic switches that may be activated once in order to provide a desired circuit adaptation. Hence the electronic fuses may be considered as having a high impedance state, which may typically also represent a "programmed" state, and may have a low impedance state, typically representing a non-programmed state of the electronic fuse. Since these electronic fuses may have a significant influence on the overall behavior of the entire integrated circuit, a reliable detection of the non-programmed and the programmed state may have to be guaranteed, which may have to be accomplished on the basis of appropriately designed logic circuitry. Furthermore, since typically these electronic fuses may be actuated once over the lifetime of the semiconductor device under consideration, a corresponding programming activity may have to ensure that a desired programmed state of the electronic fuse is reliably generated in order to provide well-defined conditions for the further operational lifetime of the device. However, with the continuous shrinkage of critical device dimensions in sophisticated semiconductor devices, the reliability of programming corresponding electronic fuses may require tightly set margins for the corresponding voltages used to program the electronic fuses, which may not be compatible with the overall specifications of the semiconductor devices or may at least have a severe influence on the flexibility of operating the device.

With reference to FIGS. 1a-1b, a typical electronic fuse in a sophisticated semiconductor device will now be described in order to more clearly set forth the difficulties in providing electronic fuses in advanced semiconductor devices.

FIG. 1a schematically illustrates a top view of a portion of a semiconductor device 150 which may represent any semiconductor device including sophisticated digital circuitry, such as a CPU core, a controller for graphic applications, memory areas and the like. The semiconductor device 150 may thus comprise a circuit portion 160, which may represent a sophisticated transistor element, such as a field effect transistor having a gate length of 50 nm and less, as previously discussed. Furthermore, the device 150 comprises an electronic fuse 100 that may represent a one-time programmable electronic switch, which may be converted from a low impedance state into a high impedance state upon a current pulse generated by applying an appropriate programming voltage to the electronic fuse 100. As illustrated, the fuse 100 comprises a first contact area 101 and a second contact area 102 and an intermediate region 103, provided in the form of a conductive line, which represents the actual fuse element which may alter its impedance state upon connecting the contact areas 101 and 102 with an appropriate voltage source. Typically, the contact areas 101, 102 and the conductive line 103 are formed of an appropriate electrode material, which may also be used for forming corresponding gate electrode structures of field effect transistors, such as is provided in the portion 160. For example, polysilicon in combination with a metal silicide are frequently used materials for forming the electronic fuse 100. Moreover, as illustrated, each of the contact areas 101, 102 may be connected to corresponding contact elements that are formed in a contact level of the device 150, as will be described in more detail with reference to FIG. 1b.

FIG. 1b schematically illustrates a cross-sectional view of the device 150 along the line Ib of FIG. 1a. As illustrated, the device 150 comprises a substrate 151, such as a silicon substrate and the like, above which is formed a layer 152, which may represent a semiconductor layer or an insulating material, depending on the position of the electronic fuse 100 within the semiconductor device 150. Furthermore, when the material 152 represents a semiconductor region, an insulating material 153 may be provided, for instance on the basis of a material as may also be used as a gate dielectric material for forming field effect transistors. Moreover, a contact level 120 is formed above the layer 152 so as to enclose the electronic fuse 100 and other circuit elements, such as transistors and the like. Typically, the contact level comprises a dielectric material 122 in combination with an etch stop material 123, such as silicon dioxide and silicon nitride, respectively, in which are formed the contact elements 121 that usually comprise a conductive material such as tungsten, possibly in combination with a conductive barrier material (not shown), such as titanium nitride and the like.

The semiconductor device 150 may be formed on the basis of well-established process techniques in which sophisticated circuit elements such as gate electrodes of field effect transistors and the like may be formed on the basis of critical dimensions of 50 nm and less. For this purpose, an appropriate gate electrode material in combination with a gate dielectric material may be provided and may be patterned on the basis of sophisticated lithography and etch techniques, wherein the contact areas 101, 102 and the region 103 may also be patterned. For example, the conductive line 103 may have a similar geometric configuration compared to gate electrode structures. That is, a width 103W (FIG. 1a) may correspond to the gate length of critical transistor elements, while a length 103L may be several hundred nanometers, depending on the overall configuration. It should be appreciated that, similarly as is the case for transistor elements, the electronic fuse 100 is also to be designed in view of not unduly consuming valuable die area in the device 150. Furthermore, in view of programmability of the fuse 100, that is, of the region 103, it is preferable to provide a minimum cross-sectional area so as to allow a significant modification of the electrical behavior of the region 103 upon applying a sufficiently high current flowing through the region 103. Consequently, the region 103 may be designed in accordance with the corresponding design rules for the device under consideration.

In a further advanced manufacturing stage, that is, patterning the gate electrode structures and thus the contact areas 101, 102 and the region 103, and after forming appropriate drain and source areas for transistor elements, typically the conductivity of semiconductor regions may be increased, for instance by forming a metal silicide in corresponding drain and source areas and gate electrodes, thereby also forming a metal silicide 104 in the contact areas 101, 102 and the region 103. This may be accomplished on the basis of well-established process techniques. It should be appreciated that, during the corresponding manufacturing process, respective sidewalls spacers 105 may also have been formed, which may typically be used for defining corresponding dopant profiles in transistor areas and act as a mask during the silicidation process. Thereafter, the contact level 120 may be formed on the basis of well-established process techniques including the deposition of the materials 123 and 122 and patterning the same in order to obtain appropriate contact openings, which are subsequently filled with conductive material, such as tungsten and the like. Next, a plurality of metallization layers (not shown) are formed, which may provide the wiring fabric for the circuit elements and also for the electronic fuse 100 in accordance with the overall circuit layout.

When operating the device 150 and programming the electronic fuse 100, a sufficiently high voltage is to be applied between the contact areas 101 and 102 in order to generate a sufficient high current density, which may result in a permanent modification in order to blow the fuse 100. For example, in this case, the per se negative effect of electromigration may be efficiently used to induce a current-driven material diffusion in the line 103, which may result in a significant modification of the electrical performance, i.e., a corresponding high impedance state may be achieved due to the "degradation" of the line 103. Electromigration is a well-known effect which may occur in conductive lines, typically metal-containing lines, when current density is very high so that the flow of electrons may cause a directed "diffusion" of ion cores, thereby increasingly transporting material along the electron flow direction. Thus, the corresponding line may increasingly suffer from a depletion of material in the vicinity of the cathode, while material may be deposited at or next to the line in the vicinity of the anode of the fuse 100. As previously discussed, a reliable distinction between a non-programmed state and a programmed state may require a corresponding significant modification of line 103, which may require significant voltages and may also require appropriately designed contact areas 101, 102 and an appropriate number of contact elements 121 connecting thereto in order to provide the required current drive capability for effecting a "blowing" of line 103. Thus, an appropriate tightly set "programming voltage window" may be required for sophisticated devices in order to obtain a high difference between the low impedance state and the high impedance state. Moreover, the corresponding margins for the programming voltage may also have to take account of any process-related fluctuations during the formation of the fuse 100, thereby requiring more tightly set programming voltages. As previously discussed, a corresponding required degree of reliability in detecting the programmed state may require sufficiently high programming voltages, which may not be compatible with the supply voltages used for sophisticated devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods for forming the same in which electronic fuses for advanced semiconductor devices may be provided so as to exhibit an increased tolerance with respect to programming voltages, while nevertheless providing a reliable programmed state. For this purpose, the electronic fuses may receive at least one portion that is designed to generate an increased current density when programming the electronic fuse so that an increased electromigration effect may be obtained in the corresponding portion. Consequently, a significant modification of the electric conductivity may be achieved at a reduced current density, thereby enabling the usage of lower voltages and also providing the possibility of generally reducing the size of corresponding contact areas and thus the size and/or the number of corresponding contact elements connected thereto, which in turn results in an overall reduced size of the electronic fuses.

One illustrative method disclosed herein relates to the forming of an electronic fuse of an integrated circuit. The method comprises forming an electrode material above an insulating material formed above a substrate of the integrated circuit. Furthermore, the method comprises forming a first contact area, a second contact area and a fuse region of the electronic fuse from the electrode material, wherein the fuse region connects to the first and second contact areas and comprises at least one non-linear portion for generating a zone of increased current density. Furthermore, the method comprises forming contact elements in a contact level of the integrated circuit, wherein the contact elements connect to the first and second contact areas of the electronic fuse.

A still further illustrative method disclosed herein relates to the designing of an electronic fuse of a semiconductor device. The method comprises providing a first contact area and a second contact area of the electronic fuse and use a plurality of linear portions of a fuse region. The method further comprises combining the plurality of linear portions to form at least one connection region having a non-linear configuration to define a zone of increased current density.

One illustrative semiconductor device disclosed herein comprises a plurality of circuit elements formed in and above a semiconductor layer. Moreover, the semiconductor device comprises an electronic fuse formed on an insulating material, wherein the electronic fuse comprises a first contact area, a second contact area and a fuse region including at least one non-linear portion that defines a zone of increased current density. Moreover, the semiconductor device comprises a contact level formed above the semiconductor layer and comprising a plurality of contact elements connecting to the plurality of circuit elements and to the first and second contact areas of the electronic fuse. Additionally, the device comprises a metallization system formed above the contact level.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a cross-sectional view of the electronic fuse of the conventional device as shown in FIG. 1a;

Figure 1A:
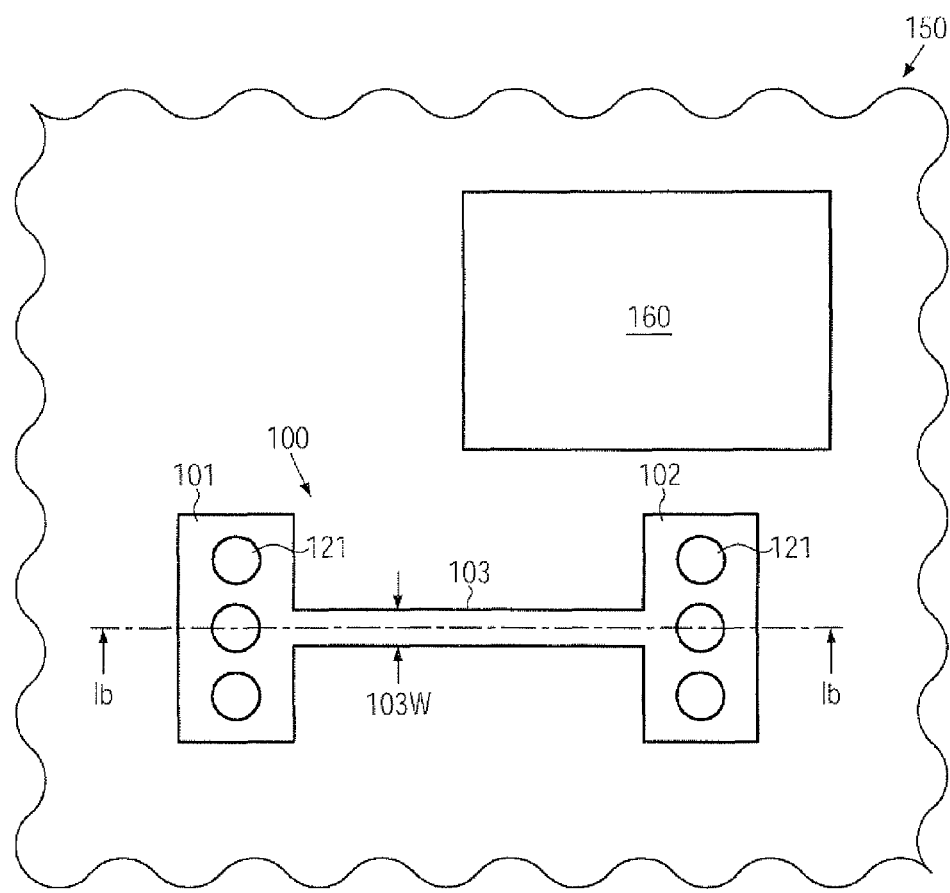
FIG. 1a schematically illustrates a top view of a conventional semiconductor device including an electronic fuse.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices, layouts and manufacturing techniques in which an electronic fuse may be provided with enhanced reliability even for highly critical dimensions, such as a width of the fuse region of approximately 50 nm and less, while at the same time providing the possibility of reducing the overall size of the electronic fuse. For this purpose, one or more zones of increased current density may be provided in the actual fuse region, thereby locally increasing the electromigration effect in these zones, possibly in combination with a depletion of dopant species when doped semiconductor material in combination with metal species is used for forming the electronic fuse. In some illustrative embodiments, the zones of increased current density may be obtained by combining linear segments or portions having a specific critical width such that at least one connection region is provided that contributes to an increased current density during a programming event. For example, respective linear segments or portions may be connected so as to form an angle of approximately 90 degrees so that locally a certain degree of current crowding may be generated upon applying a programming pulse to the electronic fuse. Consequently, the current crowding and thus increased current density may result in an increase of the local current density, which in turn may result in a more pronounced modification of the overall conductivity of the electronic fuse.

Figure 1B:
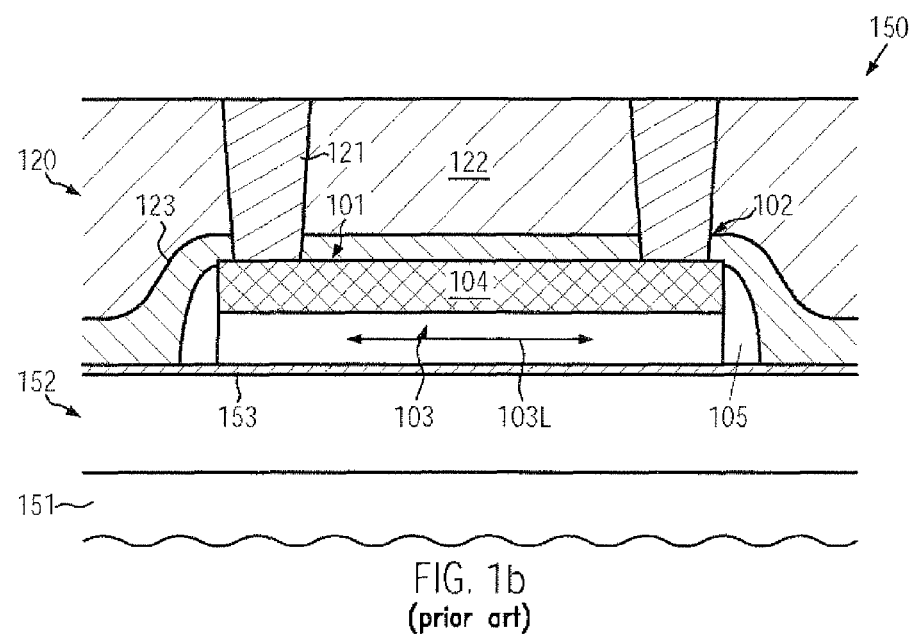
Figures 2A, 2B:
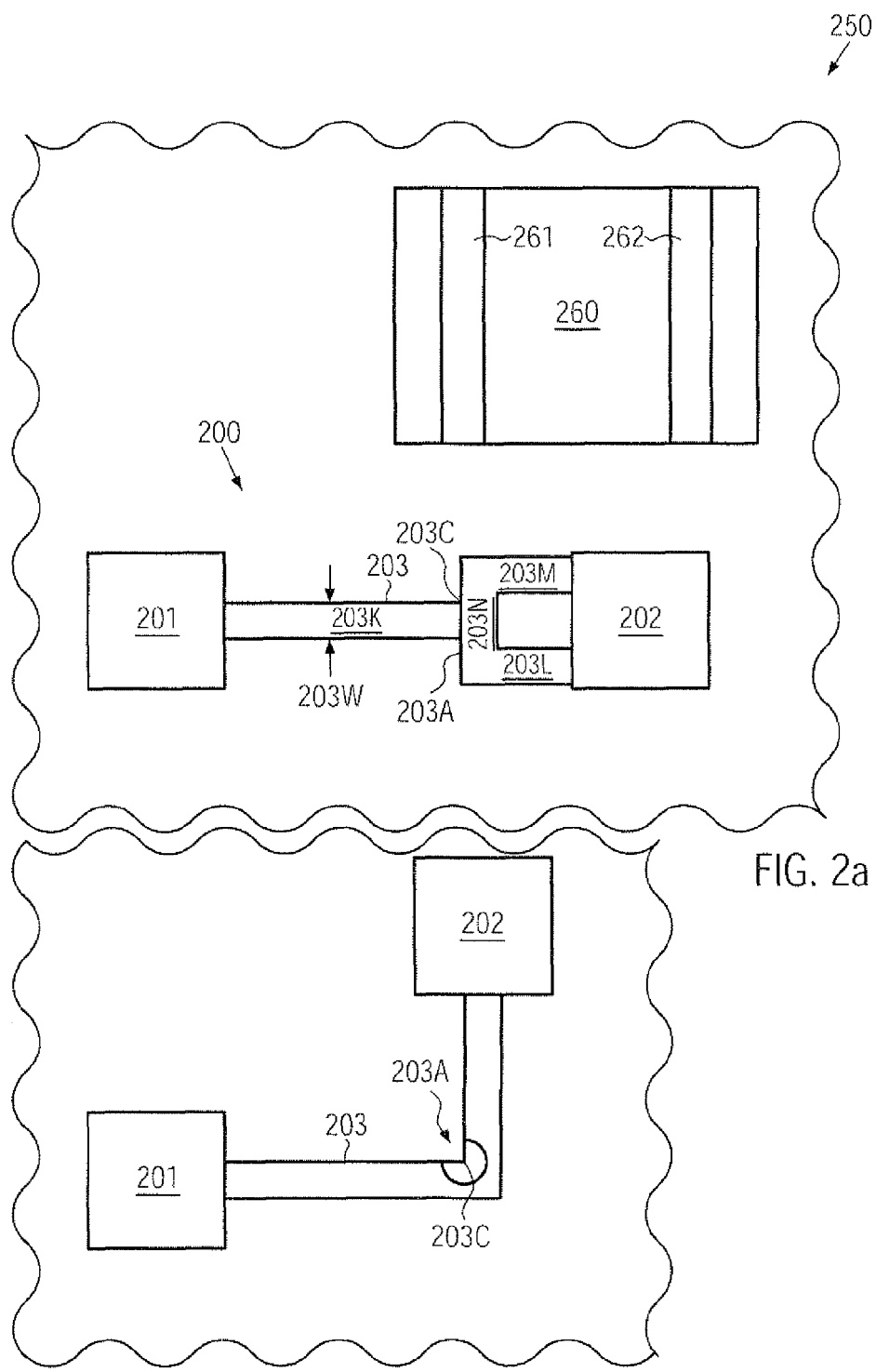
FIGS. 2a-2b schematically illustrate top views of a portion of a semiconductor device including a circuit portion and an electronic fuse having a zone of increased current density, according to illustrative embodiments.
Figure 2C:
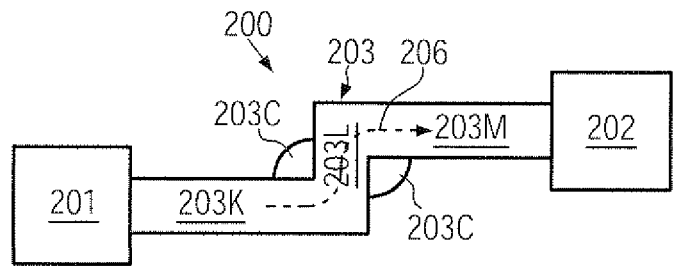
FIGS. 2c-2f schematically illustrate top views of respective layouts or actual electronic fuses including a chain configuration, in which a plurality of linear fuse regions are connected in series so as to obtain two or more zones of increased current density, according to further illustrative embodiments.
Figure 2D:
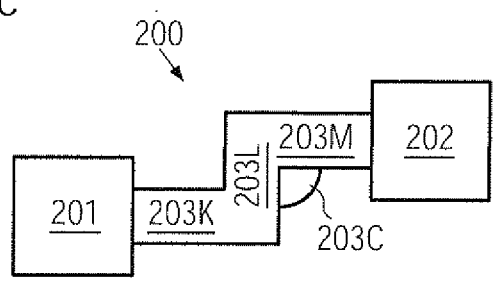
Figure 2E:
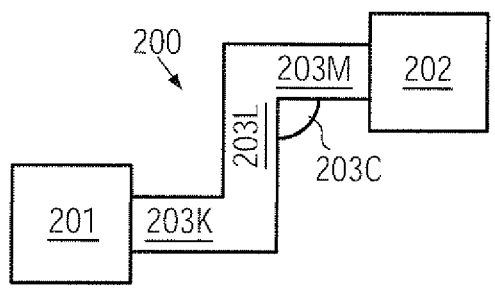
Figure 2F:
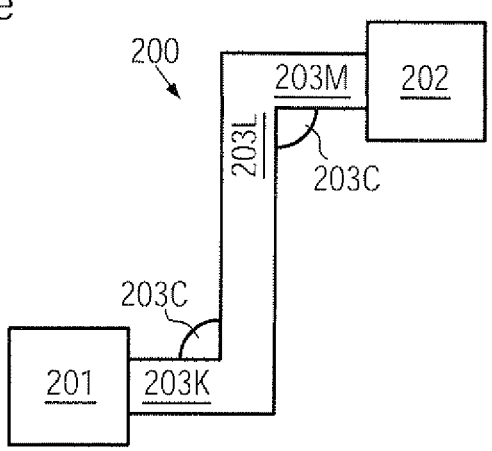
Figure 2G:
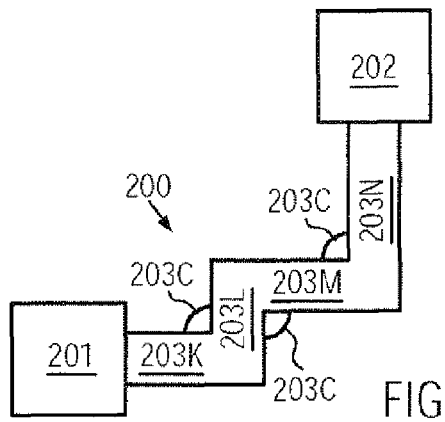
FIG. 2g schematically illustrates a layout or an actual electronic fuse including three zones of increased current density obtained on the basis of a chain-like configuration.
Figure 2H:
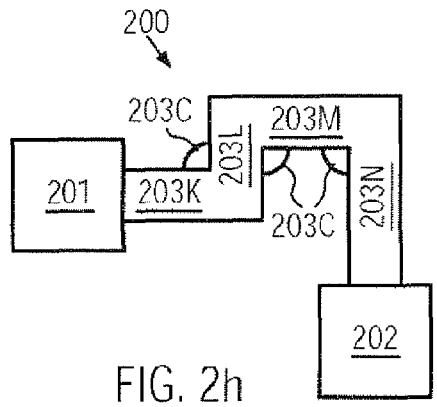
FIG. 2h schematically illustrates a top view of an exemplary electronic fuse in which portions thereof may be provided in a "u-turn" configuration in laterally restricted areas.
Figure 2I:
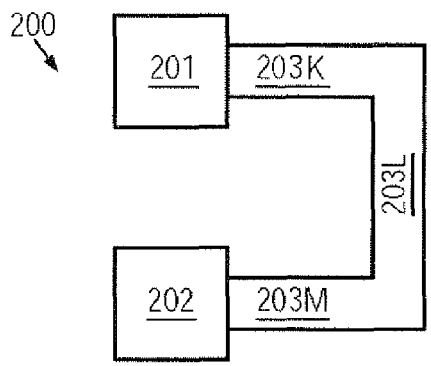
FIGS. 2i-2l schematically illustrate top views of a layout or an actual implementation of an electronic fuse including a fuse region comprised of a "u-like" configuration according to still further illustrative embodiments.
Figure 2J:
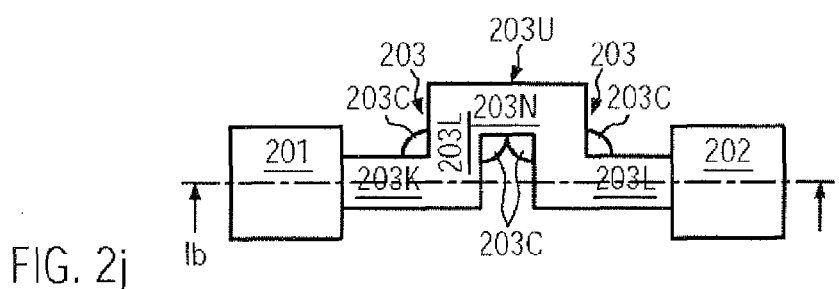
Figure 2K:
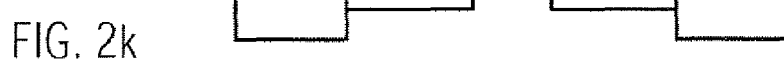
Figure 2L:
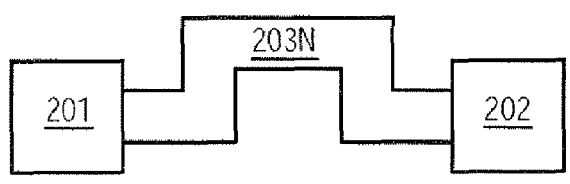
Figure 2M:
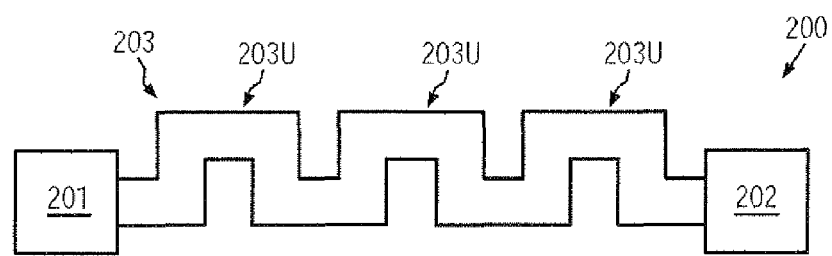
FIG. 2m schematically illustrates a top view of a layout or an actual implementation of an electronic fuse in which the fuse region may comprise a plurality of "u-turns," according to still further illustrative embodiments.
Figure 2N:
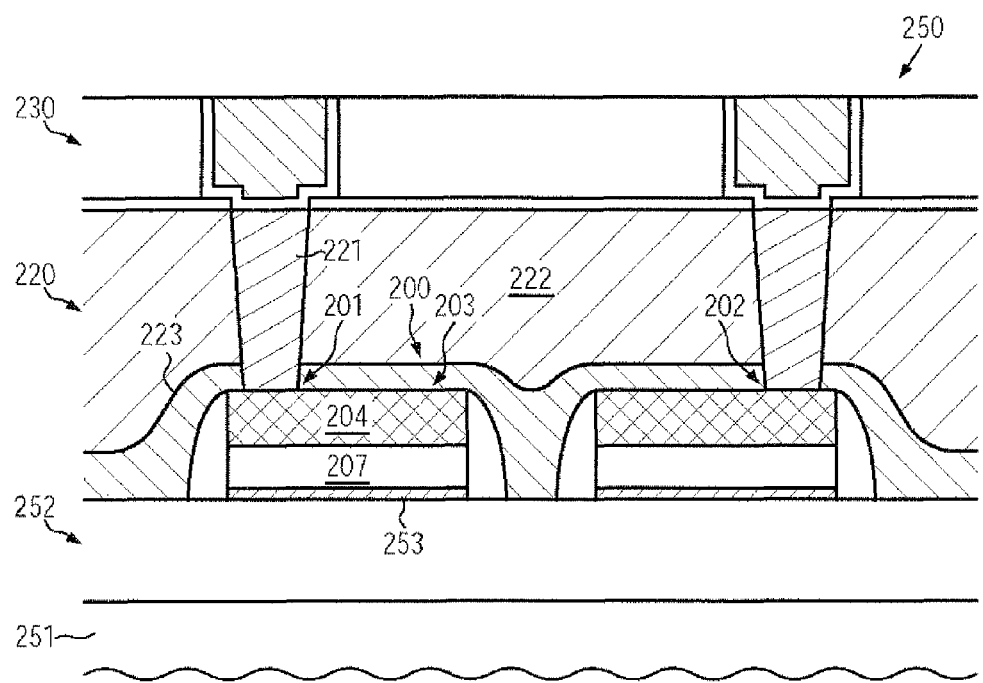
FIG. 2n schematically illustrates a cross-sectional view of a semiconductor device including an electronic fuse, according to illustrative embodiments.

With reference to FIGS. 2a-2n, further illustrative embodiments will now be described in more detail, wherein reference may also be made to FIGS. 1a-1b, if appropriate.

FIG. 2a schematically illustrates a top view of a semiconductor device 250, which may comprise a circuit portion 260 formed on the basis of a plurality of circuit elements, such as transistors 261, 262 and the like. It should be appreciated that the circuit portion 260 may represent any portion of a complex circuit, such as a digital circuit portion and the like, which may or may not be functionally connected to an electronic fuse 200. That is, as previously explained, for detecting a state of the electronic fuse 200 and also for programming the same at any appropriate point in time, corresponding circuitry may be required, for instance in the form of logic gates and the like, which may represent a part of the circuit portion 260. The electronic fuse 200 may comprise a first contact area 201 and a second contact area 202 and a fuse region 203, which may represent the region in which a change of conductivity may be generated on the basis of electromigration, dopant depletion and the like, as is also previously explained. The region 203 may comprise one or more portions or zones of increased current density when the electronic fuse 200 is activated on the basis of an appropriate programming voltage. In some illustrative embodiments, the fuse region 203 may comprise one or more non-linear portions, for instance represented by the corners 203C, which may be obtained by using a plurality of linear portions 203K, 203L, 203M, 203N that may be connected so as to define a "fork-like" configuration connecting to the contact area 202.

FIG. 2b schematically illustrates a top view of the electronic fuse 200 according to further illustrative embodiments in which a single portion 203C may be provided on the basis of two linear portions 203K, 203L which may be connected to define the region 203C resulting in zone 203A of increased current density upon applying a programming voltage. Thus, the electrical performance of the electronic fuse 200 may be significantly different compared to the conventional electronic fuse 100 (FIGS. 1a and 1b) due to the provision of a non-linear configuration of the fuse region 203, which may thus include at least one portion 203C resulting in a zone of increased current density 203A upon programming the electronic fuse 200.

The semiconductor device 250 may be formed on the basis of well-established process techniques, as are also described with reference to the semiconductor device 150, wherein, however, during the design phase of the device 250, the non-linear configuration of the fuse region 203 is taken into consideration. Thus, during the design of the electronic fuse 200, the enhanced efficiency of applying a programming pulse may also be taken into consideration by, for instance, reducing the lateral size of the first and second contact areas 201, 202 and by reducing the number and/or the size of corresponding contact elements connecting thereto, since a magnitude of the programming current required may be reduced, thereby offering the possibility of reducing the drive current capabilities of any conductive lines connecting to the electronic fuse 200. Hence, upon designing the semiconductor device 250, the electronic fuse 200 may be defined on the basis of corresponding critical dimensions for the technology under consideration, while each fuse 200 may consume less die area, thereby providing significant space-saving of the device 250 compared to the conventional device 150 for otherwise identical technology standards. Hence, during the manufacturing sequence for forming the device 250, the appropriate process techniques may be applied, as previously described, while the additional die area may be used for additional circuitry, test structures and the like.

FIGS. 2c-2f schematically illustrate top views of further designs or actual implementations of the electronic fuse 200 according to further illustrative embodiments.

FIG. 2c schematically illustrates the electronic fuse 200 in which a "chain configuration," comprised of three linear portions 203K, 203L and 203M, is provided and is connected such that two portions 203C of increased current density are defined. That is, the linear portions 203K and 203L are connected so as to form an angle of approximately 90 degrees and also the portions 203L and 203M are combined so as to define an angle of approximately 90 degrees, however of opposite "direction" compared to the linear portions 203K, 203L. Furthermore, in the embodiment shown, the length of the linear portions 203K, 203M may be significantly greater compared to the length of the portion 203L, so that the corresponding portions 203C may be provided in close proximity to each other, thereby even further enhancing the overall current crowd effect, as indicated by arrow 206.

FIGS. 2d, 2e and 2f schematically illustrate various variations of the configuration as shown in FIG. 2c, wherein, for instance, the length of the corresponding portions 203L is increased. For example, if a specific total length of the region 203 may be desired, while not unduly increasing the distance between the contact areas 201, 202, the individual length of the portions 203K, 203L, 203M may be appropriately selected in accordance with the design requirements while nevertheless providing two portions 203C providing the desired current crowding upon programming the electronic fuse 200.

FIG. 2g schematically illustrates a top view of a layout or an actual implementation of the electronic fuse 200 in which three portions 203C of increased current density may be provided on the basis of a "chain configuration" for linear portions 203K, 203L, 203M, 203N. Also in this case, two connected linear portions are connected such that the corresponding connection region 203C defines an angle of approximately 90 degrees.

FIG. 2h schematically illustrates a top view of the electronic fuse 200, in which three connection portions 203C may be provided at a laterally restricted area by using a "u-turn" configuration in the form of the linear portions 203L, 203M, 203N in combination with an additional angled configuration by connecting the linear portion 203K with the portion 203L according to a 90 degree angle. Thus, a high degree of flexibility in creating more than one connection portion 203C may be provided, wherein the position of the corresponding contact areas 201, 202 may also be selected with a high design flexibility, thereby also providing the possibility of appropriately taking advantage of the area saving obtained by the efficient non-linear configuration of the fuse region 203.

FIGS. 2j-2l schematically illustrate top views of layouts or actual implementations of the electronic fuse 200 according to further illustrative embodiments in which a basic configuration with respect to the contact areas 201, 202 and the fuse region 203 is provided, wherein, however, an additional "u-turn" is provided in the fuse region 203 in order to provide connection portions 203C to define corresponding zones of increased current density.

FIG. 2j schematically illustrates the fuse region 203 with linear portions 203K, 203L that connect to a "u-turn" portion 203U, the "width" of which may be substantially determined by the length of a portion 203N. Consequently, due to the reduced length of the portion 203N in the u-turn 203U, the respective portions 203C of increased current density formed in combination with the portions 203K, 203L may be positioned in close proximity to each other, thereby providing a high efficiency in obtaining an electromigration effect upon programming the fuse 200.

FIGS. 2k and 2l schematically illustrate the electronic fuse 200 according to illustrative embodiments in which the corresponding length of the portion 203N in the u-turn 203U may be increased, depending on the overall design criteria.

FIG. 2m schematically illustrates a top view of the electronic fuse 200 according to a further illustrative embodiment in which a plurality of u-turns 203U may be connected in series in order to increase the number of connection portions 203C while also increasing the total length of the fuse region 203 in a space-efficient manner. Hence, in addition to increasing the overall electromigration effect, thereby enhancing the "sensitivity" of the fuse 200, also the difference between the non-programmed state and the programmed state may be increased since a significantly higher degradation of conductivity may be obtained along the entire length of the fuse region 203 compared to a reduced total length. Furthermore, the relation between contact resistance in the contact areas 201, 202 relative to the "bridge resistance" of the fuse region 203 may be increased without unduly contributing to overall space consumption of the fuse 200.

FIG. 2n schematically illustrates a cross-sectional view of an actual implementation of the electronic fuse 200 in the semiconductor device 250, for instance corresponding to the configuration as shown in FIG. 2j. As illustrated, the semiconductor 250 may comprise a substrate 251, such as a semiconductor substrate, a silicon-on-insulator (SOI) substrate and the like. Furthermore, a device layer 252 may be provided, for instance on the basis of an appropriate semiconductor layer which may comprise isolation regions, depending on the overall circuit configuration. For example, the electronic fuse 200 may be positioned above a corresponding isolation region, which may be formed in a corresponding semiconductor layer, while, in other cases, a portion of the fuse 200 or the entire fuse 200 may be formed above a semiconductor material. Moreover, the device 250 may comprise the electronic fuse 200, the contact areas 201, 202, which may be connected to a metallization system 230 by a contact level 220. The contact level 220 may comprise a dielectric material 222, for instance in combination with an etch stop material 223, in which are provided contact elements 221 connecting to the areas 201, 202, respectively.

The semiconductor device 250 may be formed on the basis of well-established manufacturing techniques, wherein, however, the basic design of the electronic fuse 200 may be accomplished on the principles as described above. Thus, the various components of the electronic fuse 200 may be formed together with other circuit elements, such as transistors and the like, on the basis of the corresponding design rules of the device level and the technology under consideration. For instance, the electronic fuse 200 may be formed together with gate electrodes of sophisticated transistor elements, such as the transistors 261, 262 (FIG. 2a), wherein the gate electrodes may be formed on the basis of a polysilicon material in combination with a metal silicide, thereby forming a metal silicide 204 on a corresponding polysilicon material 207 in the electronic fuse 200. However, due to the increased sensitivity to electromigration effects and possibly to dopant depletion of the region 203 compared to conventional configurations, as previously described with reference to the device 100, the region 203 is less sensitive to any process-related fluctuations for a given range of programming voltages compared to conventional devices. That is, for a given programming voltage and for any process-related variations, a reliably detectable high impedance state may be obtained on the basis of the fuse region 203 including one or more areas of increased current density.

In other illustrative embodiments, gate electrodes of sophisticated transistors may be formed on the basis of sophisticated materials, such as a high-k dielectric material for the gate insulation layer in combination with metal-containing gate electrode materials. Also in this case, a corresponding manufacturing sequence may be used for providing the electronic fuse 200 since increased electromigration sensitivity may be accomplished on the basis of the fuse region 203 as described above. For example, a gate dielectric material with increased permittivity, for instance having a dielectric constant of 10.0 and significantly higher, may be deposited, followed by the deposition of an appropriate sophisticated gate electrode material. Thus, a corresponding insulating material 253 may also be provided in the region 203, followed by the metal-containing gate electrode material. For instance, the material 204 representing a metal-containing material may extend completely down to the insulating layer 253. Thus, the electronic fuse 200 may be formed on the basis of a sophisticated manufacturing technique without adding additional process complexity, while a high degree of sensitivity with respect to an intended electromigration effect during the programming of the fuse 200 may still be accomplished.

FIG. 2i schematically illustrates the electronic fuse 200 such that a "u-like" configuration is obtained. That is, the three linear portions 203K, 203L and 203M are connected in series so as to define two angles of approximately 90 degrees oriented in the same direction so that a corresponding current flow may be anti-parallel in the portions 203M, 203K upon programming the electronic fuse 200.

As a result, the present disclosure provides techniques, layouts and methods for forming electronic fuses that may exhibit increased sensitivity to electromigration effects, thereby allowing the usage of a wider window of programming voltages while also reducing the sensitivity to process-related variations. Furthermore, the overall space consumption of the electronic fuses may be reduced, since corresponding contact elements may be reduced in size and/or in number.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an electronic fuse of an integrated circuit, the method comprising:
   forming an electrode material above an insulating material formed above a substrate of said integrated circuit;
   forming a first contact area, a second contact area and a fuse region of said electronic fuse from said electrode material, said fuse region connecting to said first and second contact areas, said fuse region comprising at least two non-linear portion for generating a zone of increased current density, wherein two of said at least two non-linear portions form a fork; and
   forming contact elements in a contact level of said integrated circuit, said contact elements connecting to said first and second contact areas of said electronic fuse.

2. The method of claim 1, wherein a width of linear portions of said fuse region is approximately 50 nm or less.

3. The method of claim 1, wherein forming said first and second contact areas and said fuse region comprises forming a metal silicide in said electrode material.

4. The method of claim 2, wherein forming said first and second contact areas and said fuse region comprises providing said electrode material at least partially as a metal-containing material prior to patterning said electrode material.

5. The method of claim 1, wherein said at least two non-linear portion of said fuse region comprises two connected linear portions.

6. The method of claim 5, wherein said two connected linear portions are formed so as to connect to each other on the basis of a target angle of approximately 90 degrees.

7. The method of claim 1, wherein said two or more non-linear portions each generates a respective zone of increased current density.

8. The method of claim 7, wherein two or more non-linear portions are formed by a sequence of connected linear portions of said fuse region.

9. A method of designing an electronic fuse of a semiconductor device, the method comprising:
   providing contact elements in a contact level of said semiconductor device;
   providing a first contact area and a second contact area of said electronic fuse, wherein said contact elements connect to the first and second contact area;
   using a plurality of linear portions of a fuse region; and
   combining said plurality of linear portions so as to form at least one connection region having a non-linear configuration to define a zone of increased current density, wherein at least some of said plurality of linear portions are combined to form a fork-like structure.

10. The method of claim 9, wherein each of said linear portions has a design width of approximately 50 nm or less.

11. The method of claim 9, wherein said plurality of linear portions are combined so as to form a single connection region having said non-linear configuration.

12. The method of claim 11, wherein said connection region is formed by a target angle of approximately 90 degrees.

13. The method of claim 12, wherein two or more connection regions are formed on the basis of a target angle of approximately 90 degrees.

* * * * *